US006741644B1

(12) United States Patent
Dehghan et al.

(10) Patent No.: US 6,741,644 B1
(45) Date of Patent: May 25, 2004

(54) PRE-EMPHASIS FILTER AND METHOD FOR ISI CANCELLATION IN LOW-PASS CHANNEL APPLICATIONS

(75) Inventors: Hossein Dehghan, Danville, CA (US); Ting-Yin Chen, San Jose, CA (US); Dariush Dabiri, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/499,194

(22) Filed: Feb. 7, 2000

(51) Int. Cl.[7] .............................. H03H 7/30; H03H 7/40; H03K 5/159
(52) U.S. Cl. ...................................................... 375/229
(58) Field of Search ................................. 375/229, 224, 375/377; 381/23.1, 98, 71.14; 360/46; 73/35.07, 514.08

(56) References Cited

U.S. PATENT DOCUMENTS

| 5,479,522 A | * | 12/1995 | Lindemann et al. ........ 381/23.1 |
| 5,719,326 A | * | 2/1998 | Vulih et al. ................. 73/35.07 |
| 6,351,506 B1 | * | 2/2002 | Lewicki ....................... 375/377 |

* cited by examiner

*Primary Examiner*—Stephen Chin
*Assistant Examiner*—Curtis Odom
(74) *Attorney, Agent, or Firm*—Westman, Champlin & Kelly

(57) ABSTRACT

A communications receiver and method are provided for receiving a transmitted signal from a transmission channel having a low-pass filter characteristic. The receiver includes a receiver input for coupling to the channel and a switched capacitor pre-emphasis filter coupled to the receiver input. An analog-to-digital (A/D) converter is coupled to an output of the pre-emphasis filter. An equalizer is coupled to an output of the analog-to-digital converter.

17 Claims, 4 Drawing Sheets

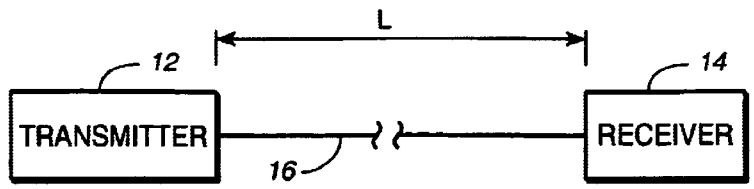
FIG._1
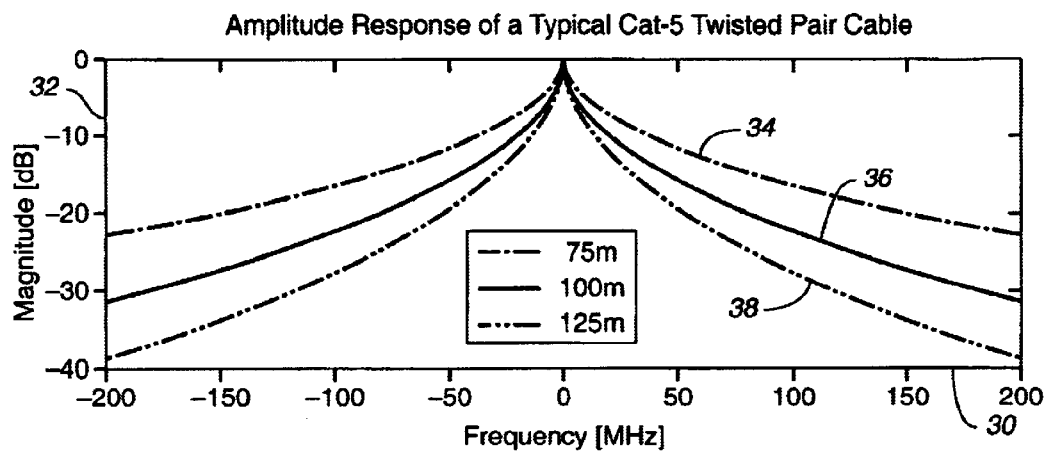
FIG._2A
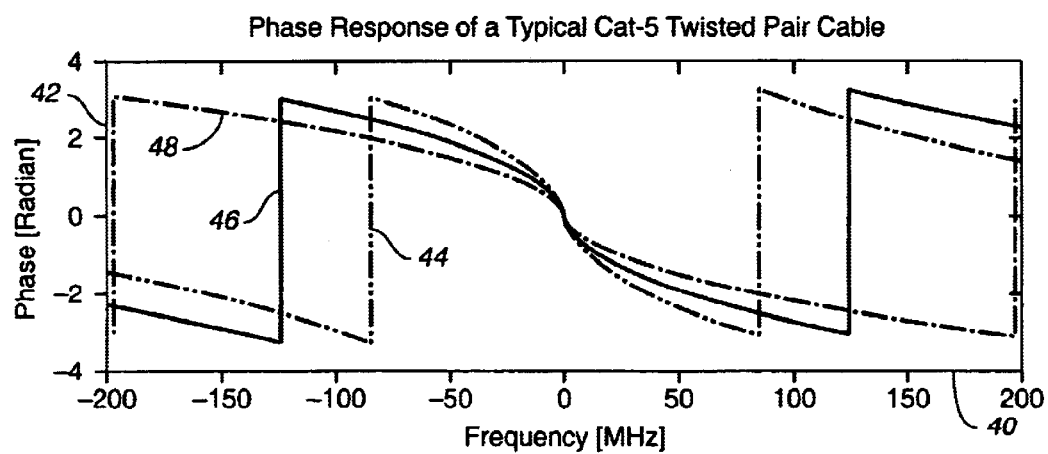
FIG._2B

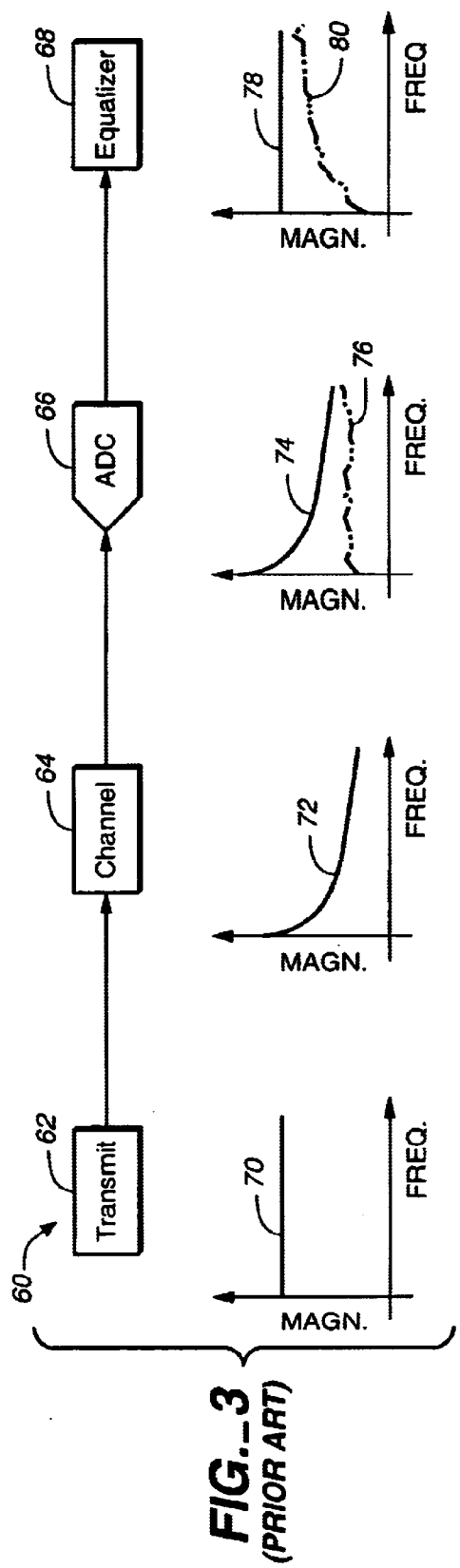
FIG._3
(PRIOR ART)
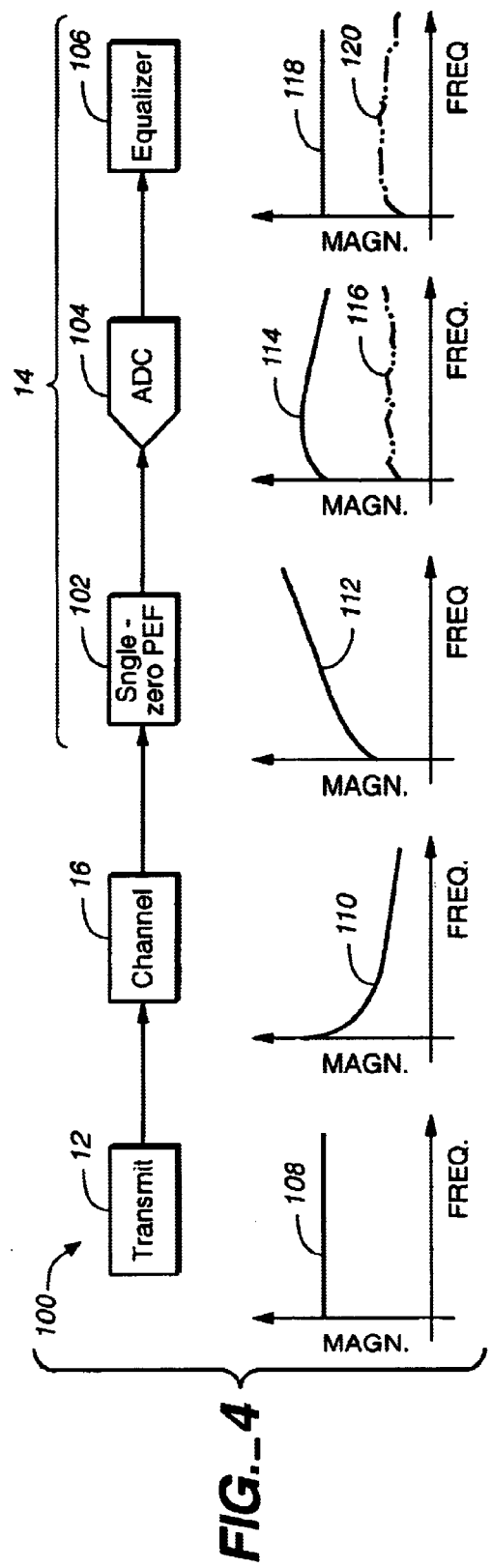
FIG._4

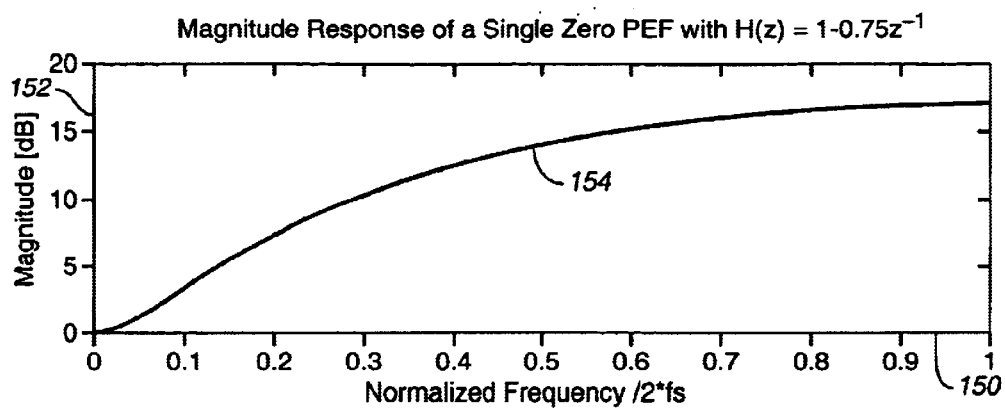
FIG._5A
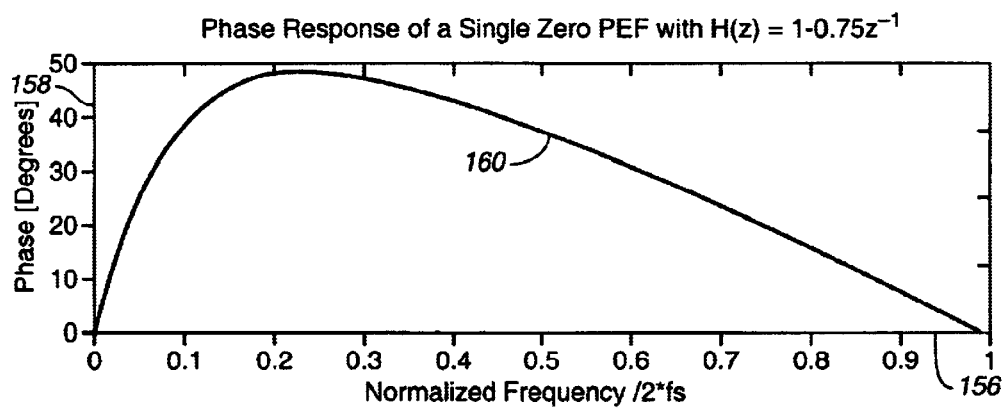
FIG._5B
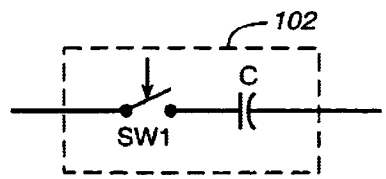
FIG._6

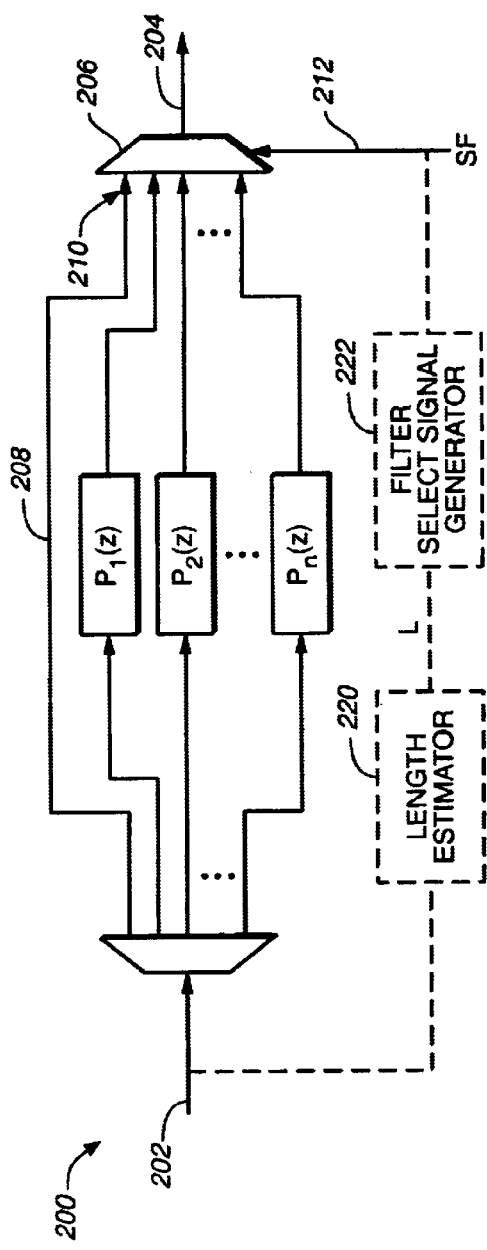
FIG._7
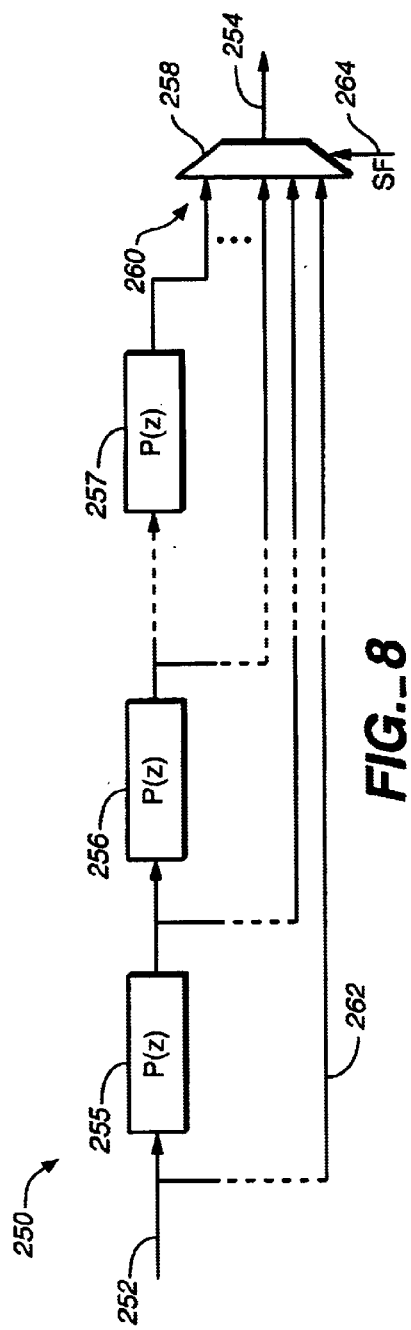
FIG._8

PRE-EMPHASIS FILTER AND METHOD FOR ISI CANCELLATION IN LOW-PASS CHANNEL APPLICATIONS

BACKGROUND OF THE INVENTION

The present relation relates to data transmission channels and, more particularly, to a receiver having a pre-emphasis filter for mitigating inter-symbol interference effects from channels having low-pass filter characteristics.

In a typical communication system, analog signals are transmitted from a transmitter to a receiver through a transmission channel. A typical receiver includes an amplifier, an analog-to-digital (A/D) converter, an automatic gain controller and an equalizer. The amplifier amplifies the received analog signal, which is then converted by the A/D converter into a series of digital values that can be processed. The automatic gain controller monitors the signal power and adjusts the amplifier gain to restore the received signal to the desired power level. The equalizer equalizes the series of digital values to match a target response for the particular channel being used.

Various types of channels have been used, such as "twisted pair" wire line channels. Such channels are commonly used for transmission of data and voice over plain old telephone systems (POTS), digital subscriber loops (DSL) and their numerous variations, home, local and wide area networks (LAN and WAN), and other applications. These types of channels have limited bandwidths and therefore act as low-pass filters, which introduce undesired inter-symbol interference (ISI) effects in the signals being transmitted.

There are three general methods for mitigating or removing the undesired ISI effects of twisted pair cables. The first method uses a fully digital equalizer after the A/D converter to cancel the ISI effects, with no analog or mixed signal filtering. This fully digital equalization method sacrifices performance since the A/D converter introduces significant quantization noise to the series of digital values on which the equalizer operates. Due to the low-pass filter nature of twisted pair cables, the root mean square (RMS) signal power attenuates much more rapidly than the peak-to-peak signal power with increasing cable length. Hence, the ratio of the RMS signal power to the peak-to-peak signal power decreases as the cable length increases.

Since the A/D converter has a dynamic range that is determined by the peak-to-peak signal power and not the RMS signal power, the effective quantization noise of the A/D converter cannot be reduced by just optimizing the conversion window range of the A/D converter to the RMS signal power. For example, for a given peak-to-peak signal power and hence A/D conversion window, a factor of two decrease in the RMS signal power would translate to 6dB of additional quantization noise. This additional quantization noise would adversely affect the system performance unless it is mitigated by adding an extra bit to the A/D converter. Adding an extra bit to the A/D converter can be very expensive since the complexity of the A/D converter increases exponentially with the number of bits used.

The second method of mitigating the undesired ISI effects uses a complex multi-pole, multi-zero analog/mixed signal high-pass pre-emphasis filter to partially cancel the channel s low-pass filtering effect. This partial cancellation aids the equalizer in equalizing the received signal to the target response. However, a complex analog/mixed signal filter is very difficult to design accurately and is very expensive in terms of power consumption and silicon area in an integrated circuit application. The design of such filters requires the implementation of resistors and capacitors in silicon. Not only do these resistors and capacitors consume power and area, they are also very sensitive to manufacturing process variations and therefore provide very inaccurate filters that require an extensive tuning circuit to achieve the specified response. The difficulty in tuning and inaccuracy of such filters increase exponentially with the filter complexity, which makes it difficult or unproductive to expect and specify an accurate filter response.

The third method of mitigating the undesired ISI effects uses a fully analog equalizer. Analog equalization suffers from some of the same analog circuit implementation shortcomings discussed above. Hence, the use of a fully analog equalizer to cancel the channel ISI effects is also not a very attractive solution.

Improved filters and methods for efficiently and economically mitigating undesired ISI effects of channels having low-pass filter characteristics are desired.

SUMMARY OF THE INVENTION

One aspect of the present invention relates to a communications receiver provided for receiving a transmitted signal from a transmission channel having a low-pass filter characteristic. The receiver includes a receiver input for coupling to the channel and a switched capacitor pre-emphasis filter coupled to the receiver input. An analog-to-digital (A/D) converter is coupled to an output of the pre-emphasis filter. An equalizer is coupled to an output of the analog-to-digital converter.

Another aspect of the present invention relates to a communications transceiver, which includes a transmitter, a transmission channel coupled to the transmitter and having a frequency response with a low-pass filter characteristic, and a receiver. The receiver includes a switched capacitor pre-emphasis filter coupled to an output of the transmission channel, an analog-to-digital (A/D) converter coupled to an output of the pre-emphasis filter and an equalizer coupled to an output of the analog-to-digital converter.

Yet another aspect of the present invention relates to a method of removing inter-symbol interference (ISI) effects from an analog signal received from a transmission channel having a frequency response with a low-pass filter characteristic. In the method, the analog signal is filtered with a switched capacitor pre-emphasis filter having a frequency response that approximates an inverse of the frequency response of the transmission channel. The step of filtering produces a filtered analog signal in which a first portion of the ISI effects are removed. The filtered analog signal is then converted to a series of digital signals, and the series of digital signals are passed through a digital equalizer to remove a second portion of the ISI effects.

BRIEF DESCRIPTION OF THE DRAWINGS

FIG. 1 is a block diagram of a communication transceiver system according to one embodiment of the present invention.

FIGS. 2A and 2B are graphs showing the frequency responses of a typical Cat-5 twisted pair cable for three different cable lengths.

FIG. 3 is a simplified block diagram of a typical transceiver system of the prior art used in twisted pair cable applications.

FIG. 4. is a simplified block diagram of a transceiver system according to one embodiment of the present invention for twisted pair cable applications.

FIGS. 5A and 5B are graphs showing the frequency responses of a single-zero switched capacitor pre-emphasis filter, according to one embodiment of the present invention.

FIG. 6 is a schematic representation of a switched capacitor pre-emphasis filter, according to one embodiment of the present invention.

FIG. 7 is a block diagram of a pre-emphasis filter according to an alternative embodiment of the present invention.

FIG. 8 is a block diagram of a pre-emphasis filter according to another alternative embodiment of the present invention.

DETAILED DESCRIPTION OF THE PREFERRED EMBODIMENTS

FIG. 1 is a block diagram of a communication transceiver system according to one embodiment of the present invention. System 10 includes a transmitter 12, a receiver 14 and a channel 16 for passing analog data or voice signals from transmitter 12 to receiver 14. Channel 16 can include any type of channel having a low-pass filter characteristic. For example, transmission lines formed with copper wires, copper composite wires and or other similar materials exhibit low-pass filter characteristics. Since these wires have a limited bandwidth, the wires act as low-pass filters. The transmission lines in channel 16 can include a single-ended transmission line "wire" or a pair of differential transmission line "wires", such as a typical Cat-5 "twisted-pair" cable. Due to the low-pass filter nature of channel 16 channel 16 introduces inter-symbol interference (ISI) in the signals being transmitted through the channel. As discussed in more detail below, receiver 14 includes an efficient and economical pre-emphasis filter that approximates the inverse of the channel's frequency response to partially cancel the ISI effects in the received signal before the signal is converted to a series of digital values.

FIGS. 2A and 2B are graphs showing the frequency response of a typical Cat-5 twisted pair cable for three different cable lengths. FIG. 2A shows the amplitude response, with X-axis 30 representing frequency in megahertz and Y-axis 32 representing magnitude in dB. Curves 34, 36 and 38 represent the amplitude responses cables having lengths of 75 m, 100 m and 125 m, respectively. FIG. 2B shows the phase response, with X-axis 40 representing frequency in megahertz and Y-axis 42 representing phase in radians. Curves 44, 46 and 48 represent the phase responses of cables having lengths of 75 m, 100 m and 125 m, respectively. FIGS. 2A and 2B show the low-pass filter nature of Cat-5 twisted pair cables in which the magnitude of the response decreases with increasing cable length.

The frequency responses shown in FIGS. 2A and 2B can be characterized by the well-known equation:

$$A(f) = e^{l\sqrt{j2\pi\gamma f}} \quad \text{Eq. 1}$$

where "$f$" is frequency, "$l$" is the cable length and "$\gamma$" is the propagation constant.

It can be seen from Equation 1 that signal attenuation in a Cat-5 twisted pair cable is an increasing function of the square-root of the signal frequency $f$ and of the cable length $l$. Other twisted pair cables (non-Cat-5 cables) have the same overall frequency responses, with attenuation increasing with frequency and cable length.

FIG. 3 is a simplified block diagram of a typical transceiver system used in twisted pair applications of the prior art. Transceiver system 60 includes a transmitter 62, a channel 64, an A/D converter 66 and an equalizer 68. Below each element of transceiver system 60 in FIG. 3 is a graph showing the frequency response at the output of that element. Each graph plots the magnitude of the frequency response on the Y-axis as a function of frequency on the X-axis.

Transmitter 62 transmits a signal through channel 64. Curve 70 represents the frequency response at the output of transmitter 62. The transmitted signal is assumed to be white and bandlimited for the purpose of illustration. However, this is usually not the case in practice since some type of line coding or other spectral shaping is typically used.

Curve 72 represents the frequency response at the output of channel 64, which effectively operates as a low-pass filter as shown in FIGS. 2A and 2B and in Equation 1. Channel 64 greatly attenuates the transmitted signal at higher frequencies. A/D converter 66 receives the transmitted signal from channel 64 and converts the signal to a series of digital values for processing. Due to the finite size and resolution of A/D converter 66, A/D converter 66 adds white quantization noise 76 (shown with dashed lines) to the signal.

Equalizer 68 attempts to cancel the channel ISI effects of channel 16 from the series of digital values by amplifying the attenuated frequencies such that the frequency response at the output of equalizer 68, shown by curve 78, is substantially the same as the frequency response at the output of transmitter 62, shown by curve 70. However, equalizer 68 also amplifies the quantization noise at higher frequencies, as shown by dashed line 80.

The extent of ISI cancellation and channel inversion applied by equalizer 68 is therefore directly tied to the extent of noise enhancement, with one normally being traded off against the other. This trade-off is usually made by the choice of the equalization algorithm used by equalizer 68. For example, a zero-forcing equalizer will completely invert the channel but would have the maximum noise enhancement, whereas a minimum mean square error (MMSE) equalizer would minimize the total ISI plus noise. Hence, an MMSE equalizer would only partially cancel the ISI, but would have less noise enhancement.

FIG. 4. is a simplified block diagram of a transceiver system 100 according to one embodiment of the present invention. The same reference numerals are used in FIG. 4 as were used in FIG. 1 for the same or similar elements. Transceiver system 100 includes transmitter 12, channel 16 and receiver 14, which includes pre-emphasis filter 102, A/D converter 104 and equalizer 106. Similar to FIG. 3, the frequency response at the output of each element is shown in a graph below each element, with the magnitude of the frequency response being plotted on the Y-axis as a function of frequency on the X-axis. Curve 108 represents the frequency response at the output of transmitter 12, which again is assumed to be white and bandlimited for the purpose of illustration. Curve 110 represents the frequency response at the output of channel 16 which is effectively a low-pass filter. As in FIG. 3, channel 16 greatly attenuates the transmitted signal at higher frequencies.

Pre-emphasis filter 102 approximates the inverse of the frequency response of channel 16 with an economical and efficient switched capacitor filter having a transfer function with a single zero and no poles, in one embodiment. Curve 112 represents the frequency response at the output of pre-emphasis filter 102, which functions essentially as a high pass filter. Pre-emphasis filter 102 compensates for the low-pass filtering effect of channel 16 as much as possible in the received signal before the signal is converted to a series of digital values by A/D converter 104.

Since the exact cable length in channel 16 may not be known in advance, pre-emphasis filter 102 can be designed for a more typical cable length to cancel most, but not all of the ISI in the signal without any quantization noise enhancement. Digital equalizer 106 can then be used to cancel the remaining ISI with less quantization noise enhancement.

In one embodiment, pre-emphasis filter 102 has the following transfer function:

$$H(z) = 1 - az^{-1} \qquad \text{Eq. 2}$$

where "z" is a frequency variable an "a" is a real constant. The transfer function has a root $z_o = a$, which defines the location of the zero. The location of the zero can be set to best match the inverse of the channel frequency response. The location of this zero can either be fixed based on priori ISI channel information or it can be varied adaptively to accommodate channels of various lengths.

FIGS. 5A and 5B are graphs showing the frequency response of pre-emphasis filter 102 having a switched capacitor filter used to cancel the ISI effects of a 100 m twisted pair cable, where $H(z)=1-0.75z^{-1}$. In FIG. 5A, X-axis 150 represents the frequency normalized to one-half of the sampling frequency (fs) of the switched capacitor, and Y-axis 152 represents the magnitude of the response in dB. Curve 154 shows that a single-zero switched capacitor filter function has high-pass filter characteristics which are the substantial inverse of the low-pass filter characteristics of channel 16. In FIG. 5B, X-axis 156 represents the normalized frequency, and Y-axis 158 represents phase in degrees. Curve 160 therefore represents the phase response of filter 102 as a function of frequency for a 100 m cable.

Both the amplitude response shown in FIG. 5A and the phase response shown in FIG. 5B approximate that of the 100 m twisted pair cable shown in FIGS. 2A and 2B. Although the two responses are not exactly matched, the closeness is adequate and a simple digital equalizer 106 can easily fine tune the matching. Moreover, a switched capacitor filter is very easy to implement since a single zero amounts to a delay and an add operation. The switched capacitor filter can also be accurately built without the need for any tuning since the capacitor function is implemented with switched MOS transistors rather than a traditional capacitor that is more sensitive to manufacturing process variations. Also, the switch capacitor filter consumes significantly less power and area then a traditional capacitive filter when implemented on an integrated circuit.

Referring back to FIG. 4, the output of pre-emphasis filter is applied to A/D converter 104, which converts the pre-filtered analog signal into a series of digital values. The output of A/D converter 104 includes the original digitized signal, shown by curve 114, with some ISI due to the pre-emphasis filter's mismatch with the inverse of the channel's frequency response plus white quantization noise, shown by dashed line 116, that is added by A/D converter 104.

Equalizer 106 compensates for this frequency response mismatch, by amplifying the attenuated frequencies in the digital values such that the frequency response at the output of equalizer 106, shown by curve 118, is substantially the same as the frequency response at the output of transmitter 12, shown by curve 108. Equalizer 106 compensates for the frequency response mismatch of pre-emphasis filter 102 at the expense of coloring the A/D quantization noise and by enhancing it at certain frequencies, as shown by curve 120. However, this noise enhancement is much less than that shown in FIG. 3 where no pre-emphasis filter was present.

Since equalizer 106 only makes slight adjustments to the series of digital signals received from A/D converter 104, equalizer 106 can be designed much simpler, if desired, than equalizer 68 shown in FIG. 3. Equalizer 106 can implement any type of digital equalization, such as an adaptive equalizer. Equalizer 106 can be a zero-forcing equalizer or an MMSE equalizer, for example. Other types of equalizers can also be used.

FIG. 6 is a schematic representation of pre-emphasis filter 102, illustrating a switched capacitor implementation, according to one embodiment of the present invention. Filter 102 includes a switch SW1 and a capacitor C, which are implemented with metal-oxide semiconductor (MOS) transistors, for example, on an integrated circuit. In one embodiment, one or more gate capacitances are rapidly charged and discharged by switch SW1 to emulate a traditional capacitor. The sample rate of switch SW1 is equal to the baud rate of the received signal. Other switched capacitor designs and sample rates can also be used.

As shown in FIGS. 5A and 5B, a switched capacitor filter has a discrete impulse response and is hence bandlimited to its sampling rate. The use of baud rate sampling and discrete-time filtering avoids enhancement of out-of-band noises due to the high-pass nature of the filter. Baud rate sampling also lowers the filter complexity, eases implementation of the filter and provides better control of the filter's frequency response.

It should be noted that although quantization noise can be the most dominant source of noise in twisted pair cable applications, other noise sources such as cross-talk and echo also exist in such systems. These noise sources are usually non-white, and their spectral power increase with frequency, which makes out-of-band noise enhancement a more serious problem. A simple continuous-time high pass filter would greatly amplify such out-of-band noises, which would be aliased back into the received signal at the A/D converter. To avoid this problem, a continuous-time pre-emphasis filter would require a sharp roll-off at or near the Nyquist frequency, which would require additional filter constraints and analog hardware. Additional filter constraints and analog hardware can result in unavoidable inaccuracy in pole placement and feedback stability. A switched capacitor filter avoids these difficulties and is very easy to implement on an integrated circuit.

Pre-emphasis filter 102 can be implemented in a variety of ways while still using the same basic switch capacitor filter as a building block. For example, FIG. 7 is a block diagram of a pre-emphasis filter 200 according to an alternative embodiment of the present invention. Pre-emphasis filter 200 includes a filter input 202, a filter output 204, a multiplexer 206, a plurality of parallel selectable switched-capacitor pre-emphasis filters $P_1(z)$, $P_2(z)$ . . . $P_n(z)$ and a bypass path 208, where "n" is an integer variable greater than zero. Filters $P_1(z)$–$P_n(z)$ and bypass path 208 are coupled in parallel to one another between filter input 202 and respective inputs 210 of multiplexer 206 to form a plurality of filter paths. The output of multiplexer 206 is coupled to filter output 204. Multiplexer 206 has a select input 212, which selects one of the plurality of filter paths as a function of a filter select signal $S_F$.

In one embodiment, receiver 14 filter select signal $S_F$ has a value that is dependent upon the length of the cable in channel 16 (shown in FIG. 1). Each of the pre-emphasis filters $P_1(z)$, $P_2(z)$ . . . $P_n(z)$ has a frequency response with a different high frequency gain, such as 2 dB, 4 dB . . . 10 dB, respectively, for n=5. This allows the high frequency gain to be increased or decreased (statically or dynamically) with changes in the cable length. For example, bypass path 208 may be more appropriate for shorter cables, while the filters having larger high frequency gain can be used for longer cables to boost the preamplification and thereby cancel the larger attenuation seen in longer cables. A single stage (with or without bypass path 208) is possible with n=1.

Filter select signal $S_F$ can be generated by receiver 14 based on cable length information at receiver 14 or by using a cable length estimator, which estimates the length of the cable from characteristics of the signal-received at the receiver. For example, receiver 14can further include cable length estimator 220 (shown in phantom), which generates a length estimate, L, based on a predetermined estimation algorithm. In one embodiment, estimator 220 estimates the cable length L based on the received signal power, which is a function of attenuation in the cable and other factors. In another embodiment, estimator 220 estimates the cable length L based on the impulse response of channel 16 which is a unique function of the cable length L. In yet another alternative embodiment, the cable length L is known in advance at receiver 14. In each of these embodiments, the cable length estimate L is provided to filter select signal generator 222. Filter select signal generator 220 generates filter select signal $S_F$ as a function of the cable length estimate L. Examples of cable length estimators and estimation algorithms are described in U.S. Ser. No. 09/484,630 which is entitled "METHOD AND APPARATUS FOR ESTIMATING THE LENGTH OF A TRANSMISSION LINE," filed on Jan. 18, 2000 and assigned to the same assignee, which is hereby incorporated by reference.

FIG. 8 is a block diagram of a cascaded selectable pre-emphasis filter 250, according to another alternative embodiment of the present invention. Filter 250 has a filter input 252, a filter output 254, a plurality of switched-capacitor pre-emphasis filters 255, 256 and 257, labeled "P(z)", and a multiplexer 258. Filters 255, 256 and 257 are coupled in series with one another between filter input 252 and one of the inputs 260 of multiplexer 258. In addition, the output of each filter is coupled to a different one of the inputs 260 of multiplexer 258 than the outputs of the other filters. Also, a bypass path 262 is coupled between filter input 252 and one of the multiplexer inputs 260, in parallel with cascaded filters 255–257.

Multiplexer 258 has a select input 264, which selects one of the multiplexer inputs as a function of filter select signal $S_F$. Again, filter select signal $S_F$ is dependent on an estimate of the cable length in one embodiment of the present invention. This estimate can be based on previously known information at receiver 14or can be generated by a cable length estimator similar to estimator 220 shown in FIG. 7. The individual filters P(z) can each have the same high frequency gain (such as 2 dB for example) or can have different high frequency gains. The overall high frequency gain of pre-emphasis filter 250 can therefore be selected through multiplexer 258 to substantially cancel the attenuation in the cable as a function of the cable length estimate.

In yet another alternative embodiment, the pre-emphasis filter of the present invention can include a hybrid of the filters shown in FIGS. 7 and 8 with one or more selectable switched-capacitor filter stages in cascade or parallel with fixed or adaptive zero locations. The number of stages or the type of filter can be controlled based on signal information at the receiver or by using the cable length estimate algorithm as discussed above. A single stage implementation is also possible with an adaptive zero location (moving zero or a zero changing between 0 and 1) can be calculated during operation of the receiver either digitally or in a mixed analog-digital mode. This zero location is adaptively adjusted to best cancel the effect of the channel ISI by increasing the high frequency gain by moving the zero closer to the unit circle for longer cables and decreasing the high frequency gain by moving the zero closer to the origin for shorter cables.

The pre-emphasis filter of the present invention provides an efficient way of reducing or eliminating the ISI effects of transmission channels having low-pass filter characteristics. The pre-emphasis filter is very easy to implement accurately without requiring any feedback or tuning techniques and does not result in any significant noise enhancement. The pre-emphasis filter is very flexible and offers many equivalent design alternatives for its implementation, depending on the specific requirements of the system and its application. There is no need to increase the A/D converter size. The pre-emphasis filter uses switched capacitors instead of the more costly and difficult to tune resistive and inductive devices. The pre-emphasis filter can be used independently or in conjunction with any type of signal processing and equalization for signal quality improvement in communication receivers within the digital and analog domains.

Although the present invention has been described with reference to preferred embodiments, workers skilled in the art will recognize that changes may be made in form and detail without departing from the spirit and scope of the invention. For example, the term "coupled" used in the specification and the claims can include a variety of connections, such as a direct connection or a connection through one or more intermediate elements. The receiver can include additional elements as desired such as an automatic gain controller, which are not specifically shown in the figures. Also, various elements of the present invention can be implemented in a hardware circuit, a software "circuit" or a combination of both.

What is claimed is:

1. A communications receiver for receiving a transmitted signal from a channel having a frequency response with a low-pass filter characteristic, the receiver comprising:

a receiver input for coupling to the channel;

an estimate of a length of the channel;

a switched capacitor pre-emphasis filter coupled to the receiver input and having a frequency response that approximates an inverse of the frequency response of the channel, wherein the frequency response of the switched capacitor pre-emphasis filter is selectable as a function of the estimate of the length of the channel; and an analog-to-digital (A/D) converter coupled to an output of the pre-emphasis filter.

2. The communications receiver of claim 1 wherein the switched capacitor pre-emphasis filter has a frequency response with a high pass filter characteristic.

3. The communications receiver of claim 2 and further comprising an equalizer coupled to an output of the analog-to-digital converter.

4. The communications receiver of claim 1 wherein the switched capacitor filter has a transfer function with a single zero and no pole.

5. The communications receiver of claim 4 wherein the transfer function has the following form:

$$H(z)=1-az^{-1}$$

where a is a real constant and z is a frequency variable.

6. The communications receiver of claim 1 wherein the switched capacitor filter has a transfer function with an adaptive zero location.

7. The communications receiver of claim 1 wherein the switched capacitor filter further comprises:

a filter input;

a filter output;

a multiplexer having a plurality of multiplexer inputs, a multiplexer output, which is coupled to the filter output, and a select input, which is coupled to a representation of the channel length estimate; and a plurality of selectable filter paths, which are coupled in parallel with one another between the filter input and a respective one of the plurality of multiplexer inputs, wherein each filter path comprises an individual switched capacitor filter stage that has a different frequency response than the switched capacitor filter stages of the other of the plurality of filter paths.

8. The communications receiver of claimed 7 wherein the switched capacitor filter further comprises:

a filter bypass path coupled between the filter input and one of the plurality of multiplexer inputs.

9. The communications receiver of claim 1 wherein the switched capacitor filter further comprises:

a filter input;

a filter output;

a multiplexer having a plurality of multiplexer inputs, a multiplexer output, which is coupled to the filter output, and a select input, which is coupled to a representation of the channel length estimate; and a plurality of individual switched capacitor filter stages coupled to the filter input in series with one another, wherein each switched capacitor filter stage has an output that is coupled to a respective one of the plurality of multiplexer inputs.

10. The communications receiver of claim 9 wherein the switched capacitor filter further comprises:

a filter bypass path coupled between the filter input and one of the plurality of multiplexer inputs.

11. The communications receiver of claim 1 wherein the switched capacitor filter further comprises:

a channel length estimate input;

a switched capacitor filter stage;

a filter bypass path coupled in parallel with the switched capacitor filter stage; and wherein the switched capacitor filter stage and the filter bypass path are multiplexed with one another as a function of the channel length estimate input.

12. A communications transceiver comprising:

a transmitter;

a transmission channel coupled to the transmitter and having a channel length and a frequency response with a low-pass filter characteristic; and a receiver comprising:

an estimate of the channel length;

a switched capacitor pre-emphasis filter coupled to an output of the transmission channel and having a frequency response with a high pass filter characteristic that approximates an inverse of the frequency response of the channel, wherein the frequency response of the switched capacitor pre-emphasis filter is selectable as a function of the estimate of the channel length; and an analog-to-digital (A/D) converter coupled to an output of the pre-emphasis filter.

13. The communications transceiver of claim 12 and further comprising an equalizer coupled to an output of the analog-to-digital converter.

14. The communications transceiver of claim 12 wherein the switched capacitor filter comprises:

filter input;

a filter output;

a multiplexer having a plurality of multiplexer inputs, a multiplexer output, which is coupled to the filter output, and a select input that is dependent on the channel length estimate; and a plurality of selectable filter paths, which are coupled in parallel with one another between the filter input and a respective one of the plurality of multiplexer inputs, wherein each filter path comprises an individual switched capacitor filter stage that has a different frequency response than the switched capacitor filter stages of the other of the plurality of filter paths.

15. The communications transceiver of claim 12 wherein the switched capacitor filter comprises:

a filter input;

a filter output;

a multiplexer having a plurality of multiplexer inputs, a multiplexer output, which is coupled to the filter output, and a select input that is dependent on the channel length estimate; and a plurality of individual switched capacitor filter stages coupled to the filter input in series with one another, wherein each switched capacitor filter stage has an output that is coupled to a respective one of the plurality of multiplexer inputs.

16. The communications transceiver of claim 12 wherein the switched capacitor filter comprises:

at least one switched capacitor filter stage;

a filter bypass path coupled in parallel with the switched capacitor filter stage; and wherein the switched capacitor filter stage and the filter bypass path are multiplexed with one another as a function of the channel length estimate.

17. A method of removing inter-symbol interference (ISI) effects from an analog signal received from a transmission channel having a frequency response with a low-pass filter characteristic, the method comprising:

filtering the analog signal with a switched capacitor pre-emphasis filter having a frequency response that approximates an inverse of the frequency response of the transmission channel to produce a filtered analog signal in which a first portion of the ISI effects are removed;

converting the filtered analog signal to a series of digital signals; and passing the series of digital signals through a digital equalizer to remove a second portion of the ISI effects from the series of digital signals.

* * * * *